(12) United States Patent
Bryant et al.

(10) Patent No.: US 7,939,417 B2
(45) Date of Patent: May 10, 2011

(54) BIPOLAR TRANSISTOR AND BACK-GATED TRANSISTOR STRUCTURE AND METHOD

(75) Inventors: Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/536,636

(22) Filed: Aug. 6, 2009

(65) Prior Publication Data
US 2009/0298250 A1 Dec. 3, 2009

Related U.S. Application Data

(62) Division of application No. 11/164,071, filed on Nov. 9, 2005, now abandoned.

(51) Int. Cl.
*H01L 21/331* (2006.01)
(52) U.S. Cl. ........ 438/334; 438/202; 438/311; 438/315; 438/355
(58) Field of Classification Search .............. 257/347, 257/350, 370, 507, 526, 565, 587, E29.183, 257/E29.186, E29.198, E21.378; 438/202, 438/311, 315, 334, 353, 355
See application file for complete search history.

(56) References Cited

U.S. PATENT DOCUMENTS

| | | | |
|---|---|---|---|
| 3,952,325 A | 4/1976 | Beale et al. | |
| 5,352,624 A * | 10/1994 | Miwa et al. | 438/155 |
| 5,736,447 A | 4/1998 | Choi et al. | |
| 6,621,108 B2 | 9/2003 | Tashiro et al. | |
| 6,636,075 B2 | 10/2003 | Nakayama et al. | |
| 7,217,988 B2 | 5/2007 | Ahlgren et al. | |
| 2004/0036497 A1 | 2/2004 | Nakayama | |
| 2004/0251517 A1 | 12/2004 | Nakashima | |
| 2005/0020023 A1 | 1/2005 | Lachner | |

OTHER PUBLICATIONS

U.S. Appl. No. 11/164,071, filed Nov. 9, 2005, Notice of Abandonment dated Sep. 15, 2009.
U.S. Appl. No. 11/164,071, filed Nov. 9, 2005, Notice of Allowance and Fees Due dated May 19, 2009.
U.S. Appl. No. 11/164,071, filed Nov. 9, 2005, Final Office Action dated Apr. 6, 2009.
U.S. Appl. No. 11/164,071, filed Nov. 9, 2005, Office Action dated Oct. 9, 2008.
U.S. Appl. No. 11/164,071, filed Nov. 9, 2005, Final Office Action dated Mar. 27, 2008.
U.S. Appl. No. 11/164,071, filed Nov. 9, 2005, Office Action dated Sep. 25, 2007.

* cited by examiner

*Primary Examiner* — Matthew E Warren
(74) *Attorney, Agent, or Firm* — Anthony J. Canale; Hoffman Warnick LLC

(57) ABSTRACT

A structure is disclosed including a substrate including an insulator layer on a bulk layer, and a bipolar transistor in a first region of the substrate, the bipolar transistor including at least a portion of an emitter region in the insulator layer. Another disclosed structure includes an inverted bipolar transistor in a first region of a substrate including an insulator layer on a bulk layer, the inverted bipolar transistor including an emitter region, and a back-gated transistor in a second region of the substrate, wherein a back-gate conductor of the back-gated transistor and at least a portion of the emitter region are in the same layer of material. A method of forming the structures including a bipolar transistor and back-gated transistor together is also disclosed.

8 Claims, 12 Drawing Sheets

BIPOLAR TRANSISTOR AND BACK-GATED TRANSISTOR STRUCTURE AND METHOD

CROSS-REFERENCE TO RELATED APPLICATIONS

This application is a divisional application of U.S. patent application Ser. No. 11/164,071, filed Nov. 9, 2005 now abandoned.

BACKGROUND OF THE INVENTION

Technical Field

The invention relates generally to semiconductor fabrication, and more particularly, to a structure, and method of forming same, including a bipolar transistor and a back-gated transistor in which the emitter region and back-gate conductor are in the same layer of material.

Background Art

The semiconductor fabrication industry is continually investigating ways to further miniaturize integrated circuits. One current area of investigation is use of back-gated complementary metal-oxide semiconductor (CMOS) transistors (BGCMOS) to provide further scaling of conventional CMOS technology. One challenge in this area, however, is integration of high-performance bipolar transistors to form bipolar CMOS devices (BiCMOS) with BGCMOS devices. That is, conventional integration schemes do not adequately integrate the two technologies.

In view of the foregoing, there is a need in the art for a solution for generating bipolar transistors and back-gated transistors together.

SUMMARY OF THE INVENTION

A structure is disclosed including a substrate including an insulator layer on a bulk layer, and a bipolar transistor in a first region of the substrate, the bipolar transistor including at least a portion of an emitter region in the insulator layer. Another disclosed structure includes an inverted bipolar transistor in a first region of a substrate including an insulator layer on a bulk layer, the inverted bipolar transistor including an emitter region, and a back-gated transistor in a second region of the substrate, wherein a back-gate conductor of the back-gated transistor and at least a portion of the emitter region are in the same layer of material. A method of forming the structures including a bipolar transistor and back-gated transistor together is also disclosed.

A first aspect of the invention provides a structure comprising: a substrate including an insulator layer on a bulk layer; and a bipolar transistor in a first region of the substrate, the bipolar transistor including at least a portion of an emitter region in the insulator layer.

A second aspect of the invention provides a structure comprising: an inverted bipolar transistor in a first region of a substrate including an insulator layer on a bulk layer, the inverted bipolar transistor including an emitter region; and a back-gated transistor in a second region of the substrate, wherein a back-gate conductor of the back-gated transistor and at least a portion of the emitter region are in the same layer of material.

A third aspect of the invention provides a method of forming a structure, the method comprising the steps of: forming a bipolar transistor on a substrate including an insulator layer on a bulk layer, the bipolar transistor including an emitter region; and forming a back-gated transistor on the substrate, wherein a back-gate conductor of the back-gated transistor and the emitter region are in the same layer of material.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
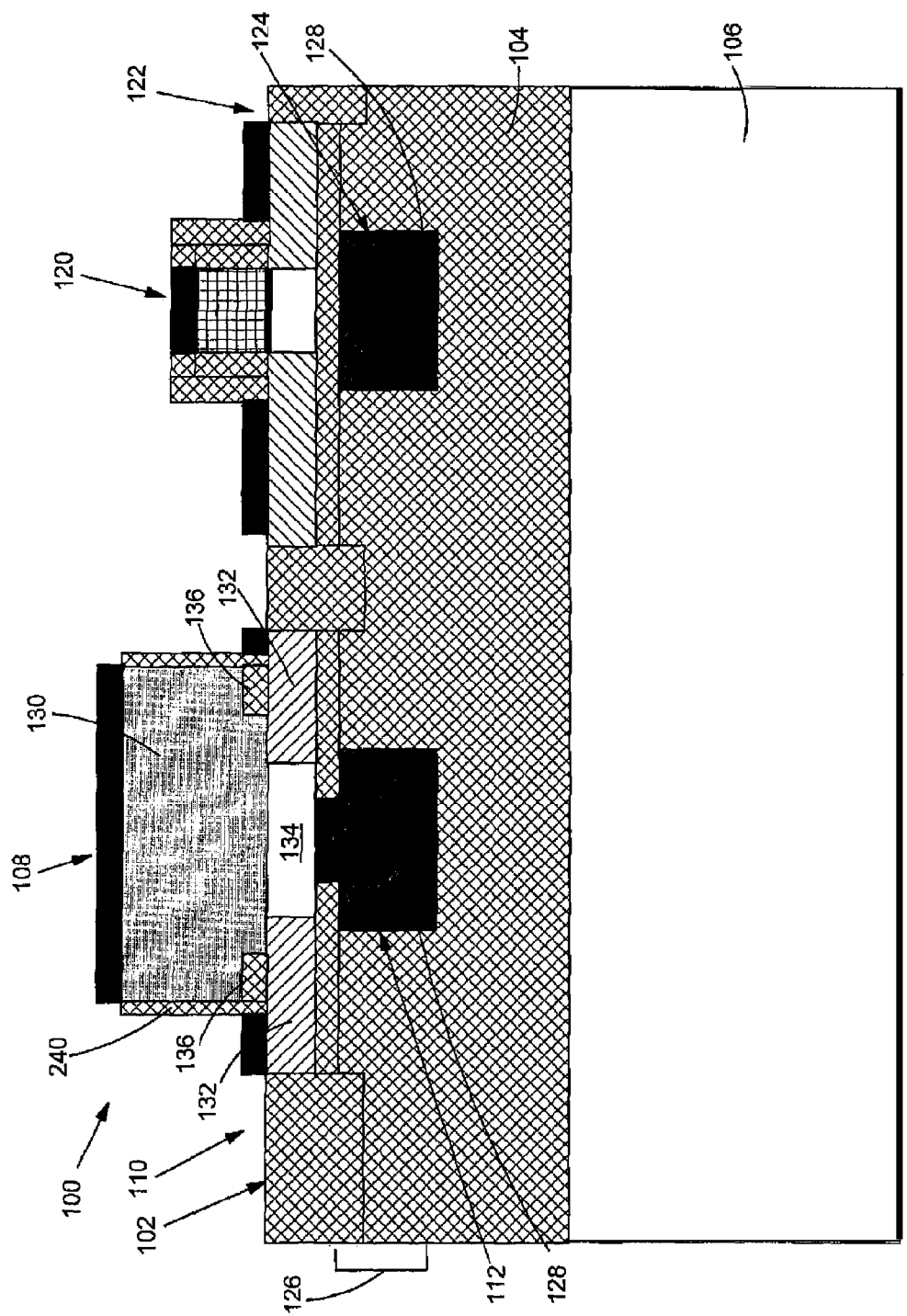
FIG. 1 shows one embodiment of a structure according to the invention.

Turning to the drawings, FIG. 1 shows a structure 100 formed according to one embodiment of the invention. Structure 100 includes a substrate 102 including an insulator layer 104 on a bulk layer 106, e.g., of silicon. Insulator layer 104 may include a dielectric material such as silicon dioxide or sapphire. A (inverted) bipolar transistor 108 is provided in a first region 110 of substrate 102 and includes at least a portion of an emitter region 112 in insulator layer 104. FIG. 1 shows one embodiment in which at least a portion, and preferably substantially all, of emitter region 112 is in insulator layer 104. Structure 100 also includes a back-gated (double gate) transistor 120 in a second region 122 of substrate 102. Back-gated transistor 120 includes a back-gate conductor 124 formed in insulator layer 104. In one embodiment, emitter region 112 and back-gate conductor 124 are in respective portions of the same layer of material 126, which may be included within insulator layer 104. Emitter region 112 and back-gate conductor 124 may include one of: single crystal silicon and polysilicon, which may be doped. Emitter region 112 and back-gate conductor 124 may also each include a silicide portion 128, e.g., tungsten silicide. With reference to bipolar transistor 108, a collector region 130 thereof extends over an extrinsic base region 132 (adjacent intrinsic base region 134) and is partially isolated therefrom by a portion of a dielectric 136. Collector region 130 may be appropriately doped monocrystalline silicon.

Turning to FIGS. 2-12, one illustrative embodiment of a method of forming the above-described structure will now be described. As shown in FIG. 1, the method overall includes forming a bipolar transistor 108 on substrate 102 including insulator layer 104 on a bulk layer 106b, the bipolar transistor including emitter region 112, and forming a back-gated transistor 120 on substrate 102. As noted above, back-gate conductor 124 of back-gated transistor 120 and emitter region 112 are preferably in the same layer of material 126. As will be described below, the forming steps occur at least partially simultaneously.

Figure 2:
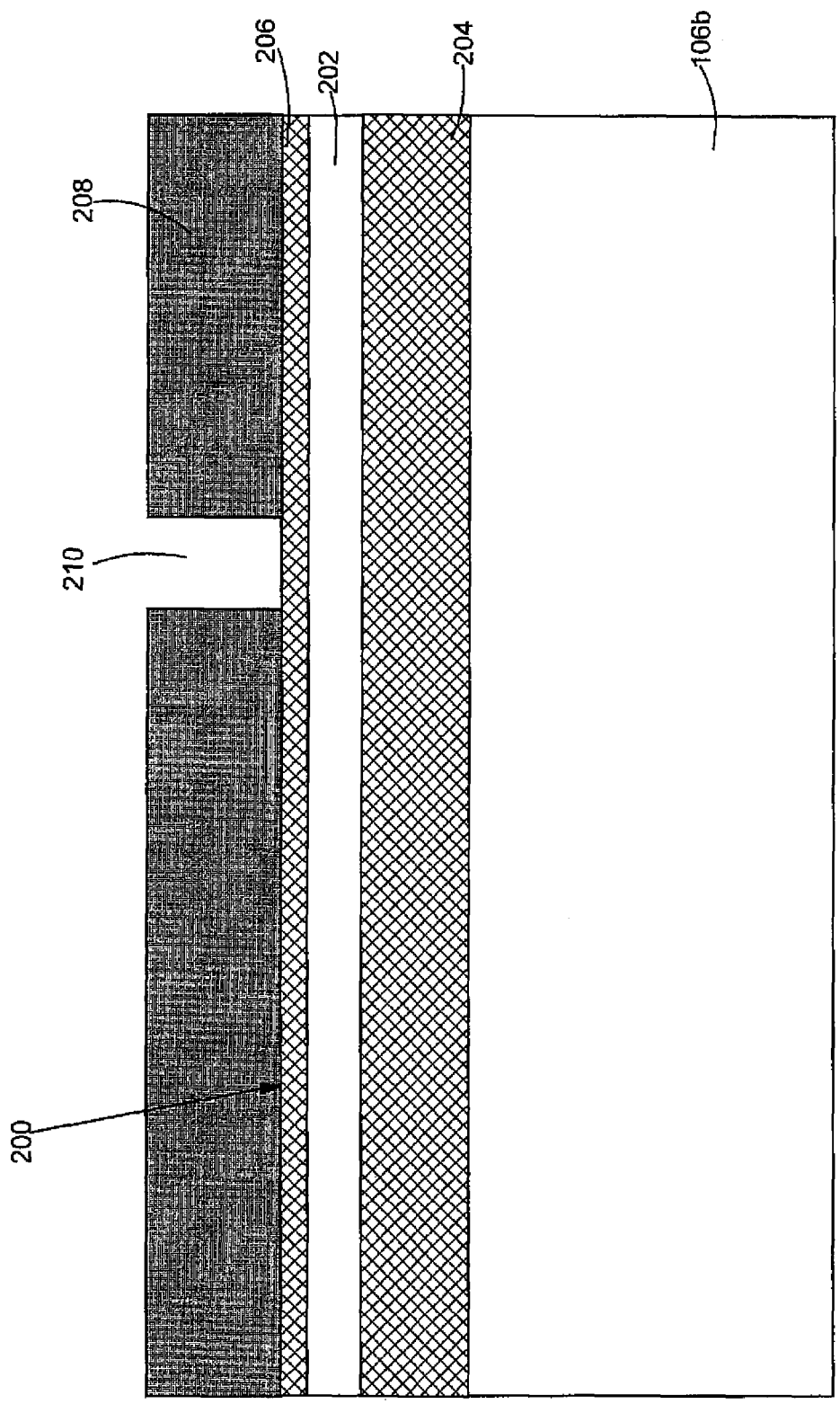
FIGS. 2-12 show one embodiment of a method of forming the structures of FIGS. 1-2 according to the invention.

Turning to the illustrative embodiment of the method of forming structure 100 (FIG. 1), FIG. 2 shows a preliminary structure 200 for implementing the invention. In one embodiment, a substrate 102 in the form of an ultra-thin silicon-on-insulator (UTSOI) structure is provided. In this case, an ultra-thin silicon layer 202, e.g., approximately 10-70 nm, is provided on an insulator layer 204 that is provided over bulk layer 106b, e.g., silicon. Insulator layer 204 may include a dielectric material, e.g., of silicon dioxide ($SiO_2$) (oxide), or may be hydrogen ($H_2$) or helium (He) implanted silicon. A gate insulator layer 206, e.g., silicon dioxide ($SiO_2$) or silicon oxy-nitride (SiON) or high dielectric constant material such as hafnium silicate, may also be provided at this stage. (Although not shown, prior to gate insulator layer 206 being formed, appropriate block masks and doping of silicon layer 202 to form intrinsic base region 134 (FIG. 1) of bipolar transistor 108 and other regions of back-gate transistor 120 may be optionally provided. As those with skill in the art will recognize, these regions may also be formed at other stages in the process.) FIG. 2 also shows a mask 208 including an opening 210 for etching an opening through gate insulator layer 206.

Figure 3:
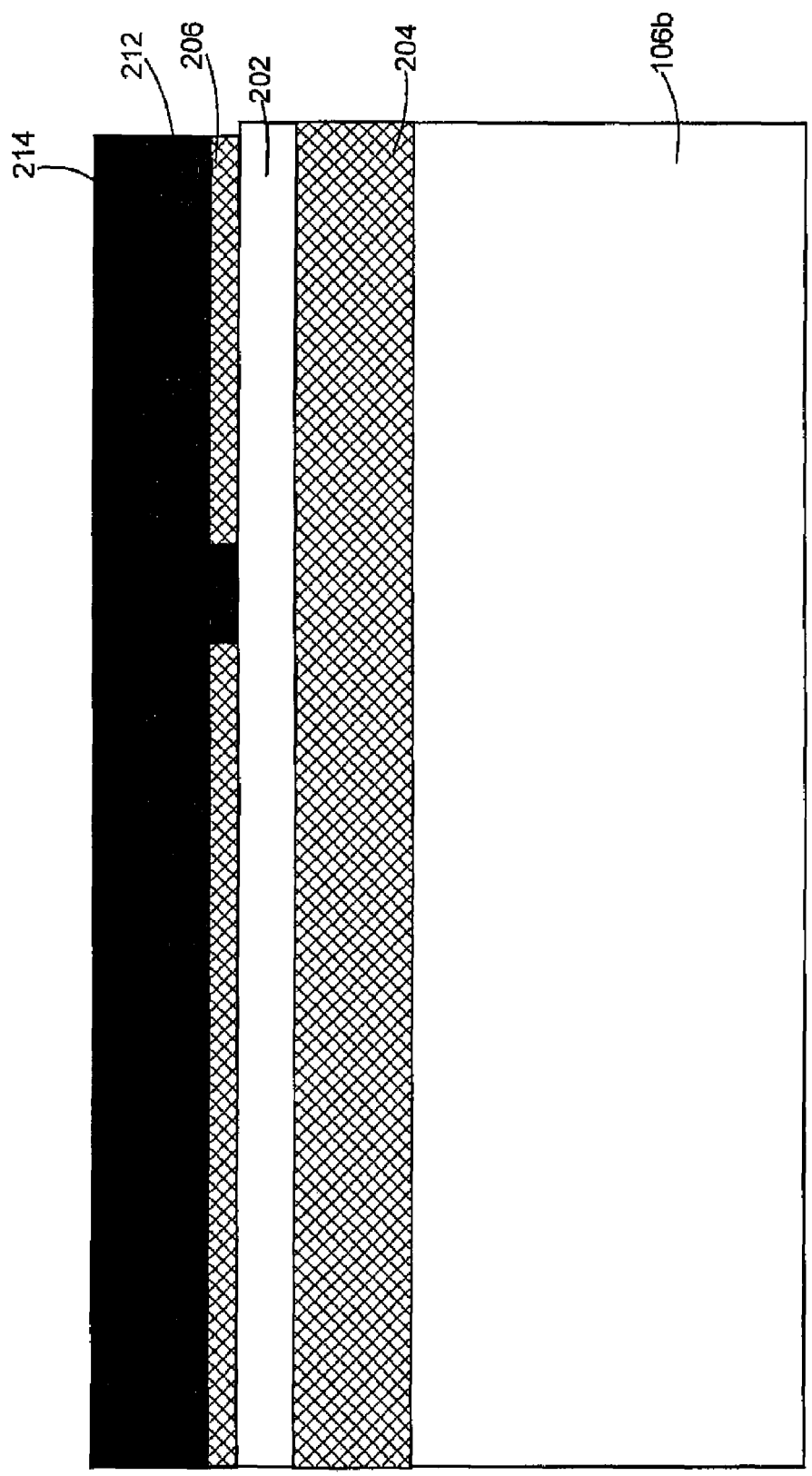

As shown in FIG. 3, a next step includes forming a polysilicon layer 212, e.g., by deposition, and forming a silicide layer 214 thereon, e.g., tungsten silicide. Polysilicon layer 212 and silicide layer 214 eventually become emitter region 112 (FIG. 1) and back-gate conductor 124 (FIG. 1). As noted above, silicide layer 214 may be omitted in some cases. As another alternative, polysilicon layer 212 could be replaced with a monocrystalline silicon, e.g., formed by epitaxial growth.

Figure 4:
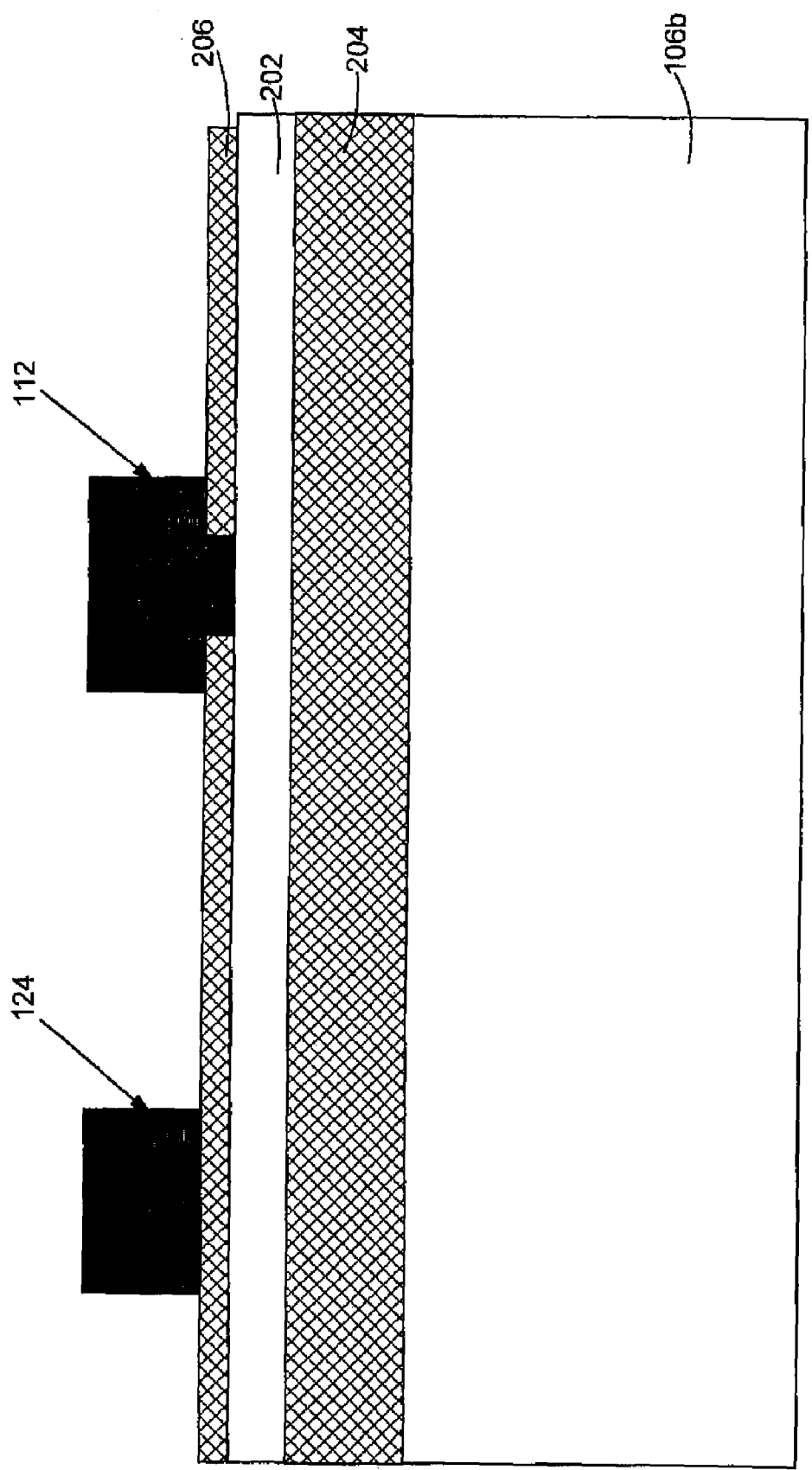
Figure 5:
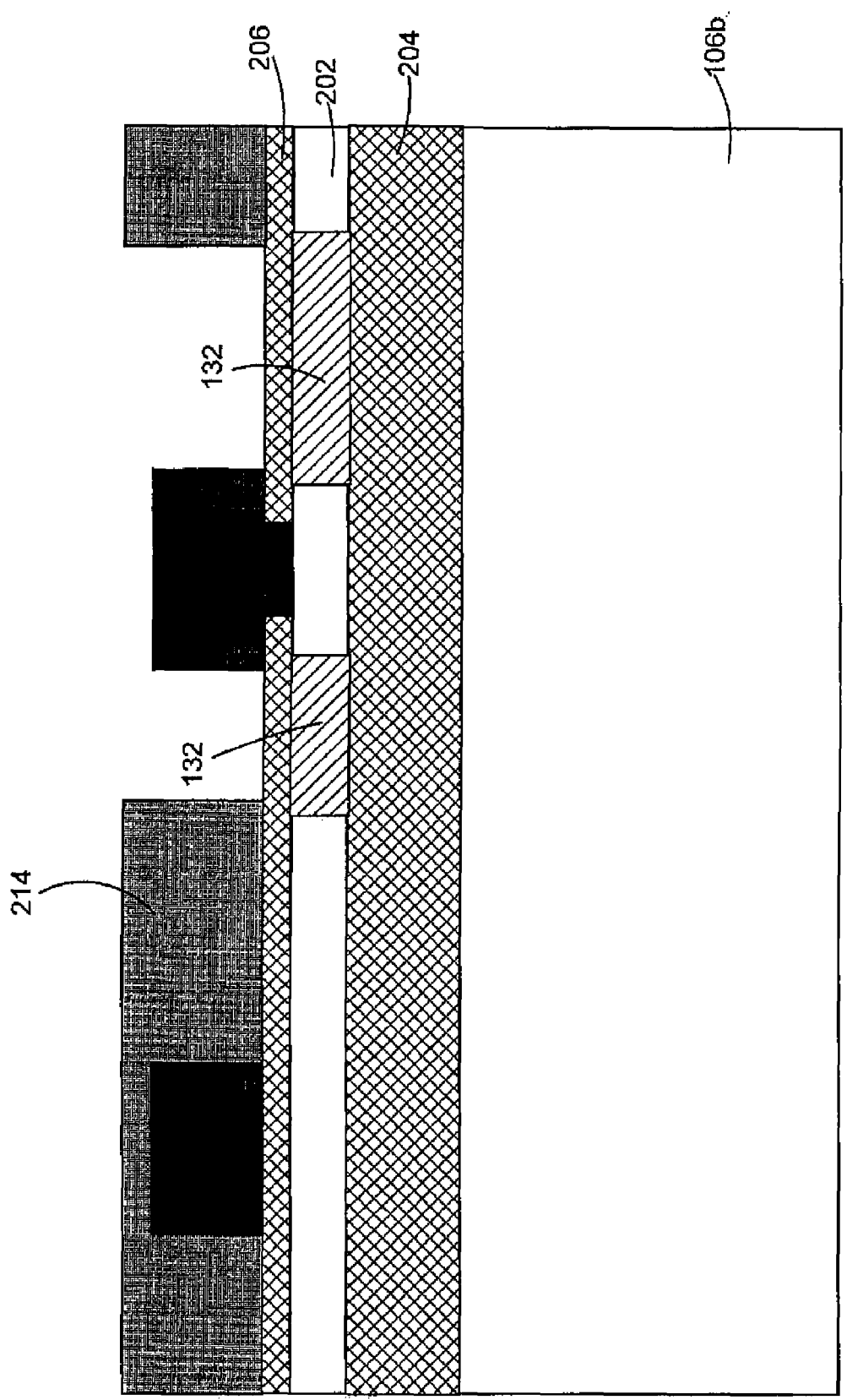
Figure 6:
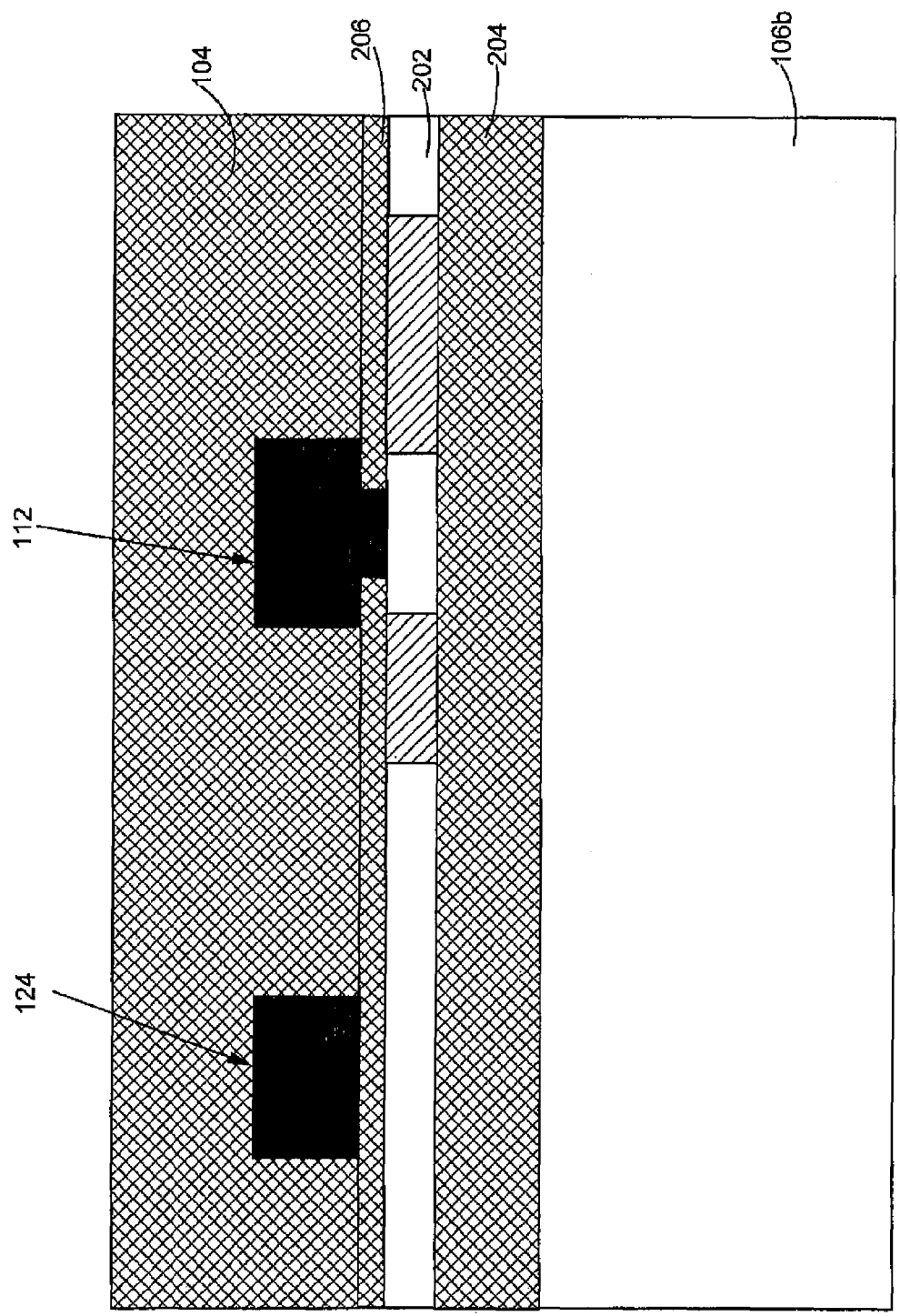

Next, as shown in FIG. 4, polysilicon layer 212 (FIG. 3) and silicide layer 214 (FIG. 3) are patterned and etched to form emitter region 112 and back-gate conductor 124. FIG. 5 shows extrinsic base region 132 via ion implantation in a conventional manner, e.g., using a mask 214 and ion implanting. FIG. 6 shows formation of insulator layer 104 after removal of mask 214 (FIG. 5). This step may include, for example, depositing dielectric material such as silicon dioxide ($SiO_2$) and planarizing.

Figure 7:
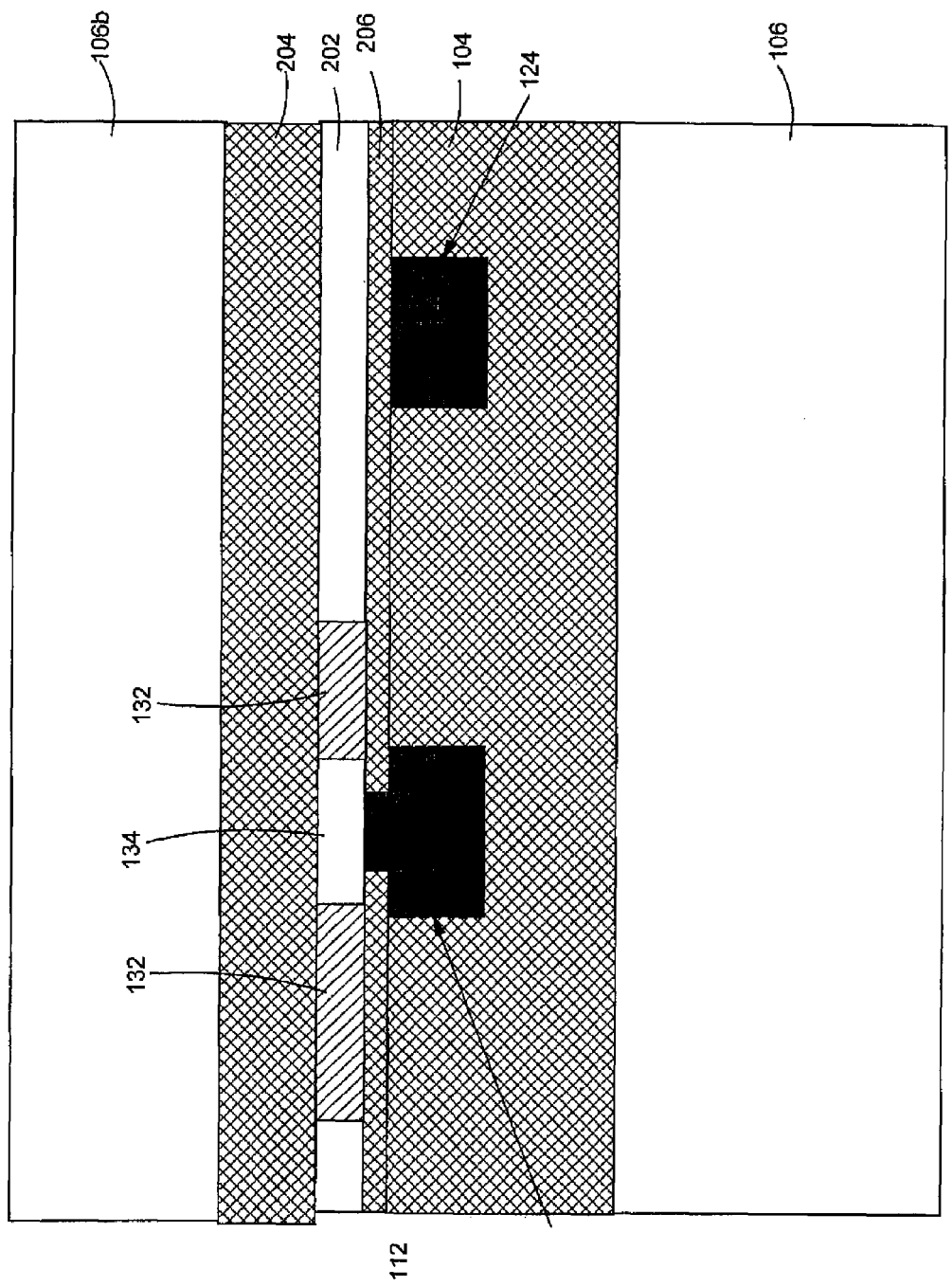

FIG. 7 shows the step of inverting the partially formed structure of bipolar transistor 108 (FIG. 1) and back-gated transistor 120 (FIG. 1). FIG. 7 shows the structure inverted and re-bonded to a new bulk layer 106, e.g., silicon. As known in the art, in some instances bulk layer 106 may include a dielectric material layer thereon such as silicon dioxide ($SiO_2$) to ensure dielectric-to-dielectric bonding.

Figure 8:
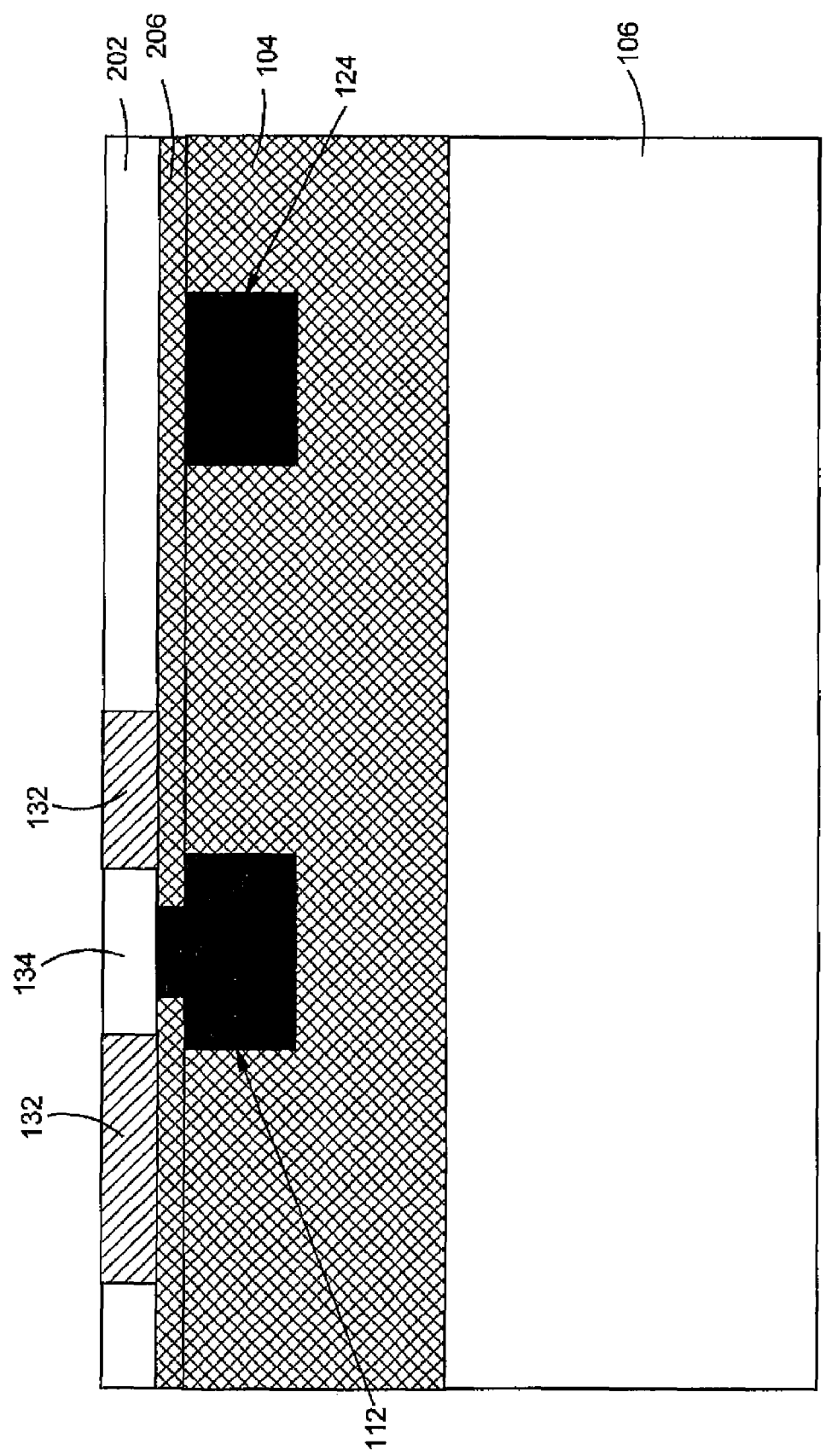

As shown in FIG. 8, a next step includes cutting the starting wafer from what is now the top surface of the silicon layer 202. This step may include any now known or later developed cutting processes, e.g., a 'smart-cut process' or etching bulk layer 106 and insulator layer 204 away. A smart-cut process includes implantation of the wafer with hydrogen, bonding the top of the wafer to a second wafer (oxide on silicon) and annealing, and splitting off the original substrate. The newly exposed surface of silicon layer 202 may be polished and/or a sacrificial silicon dioxide layer formed and stripped to improve the surface quality.

Figure 9:
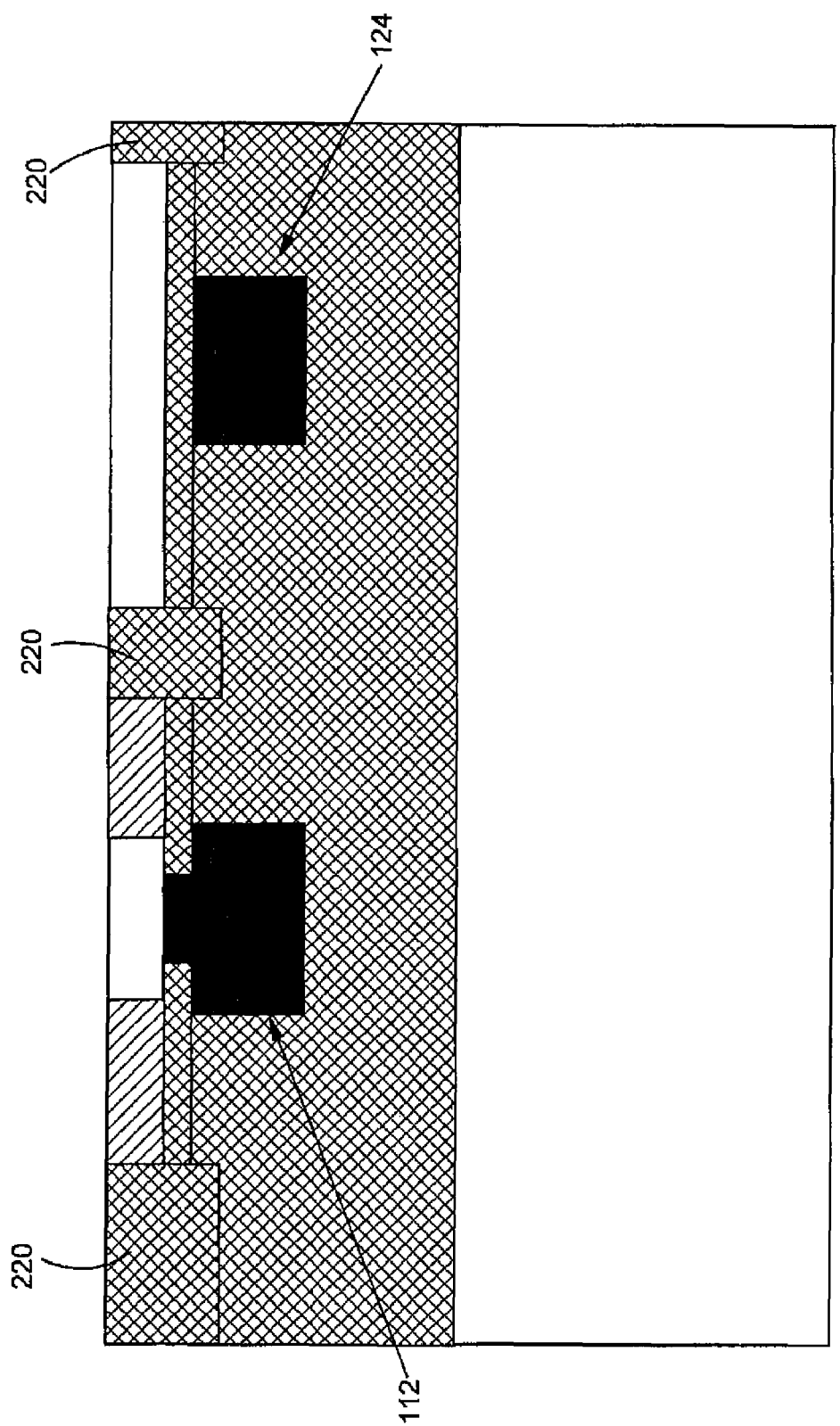
Figure 10:
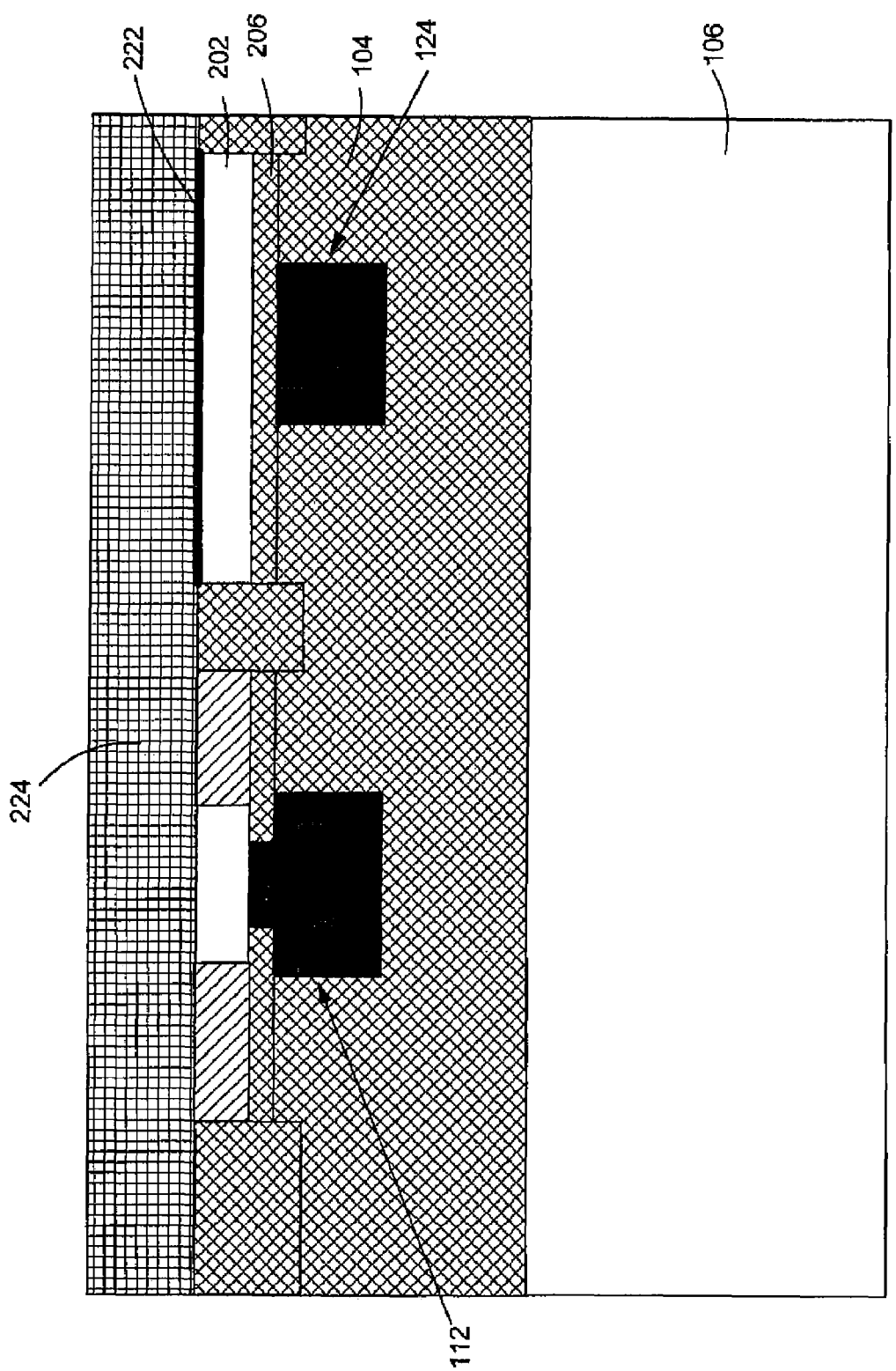
Figure 11:
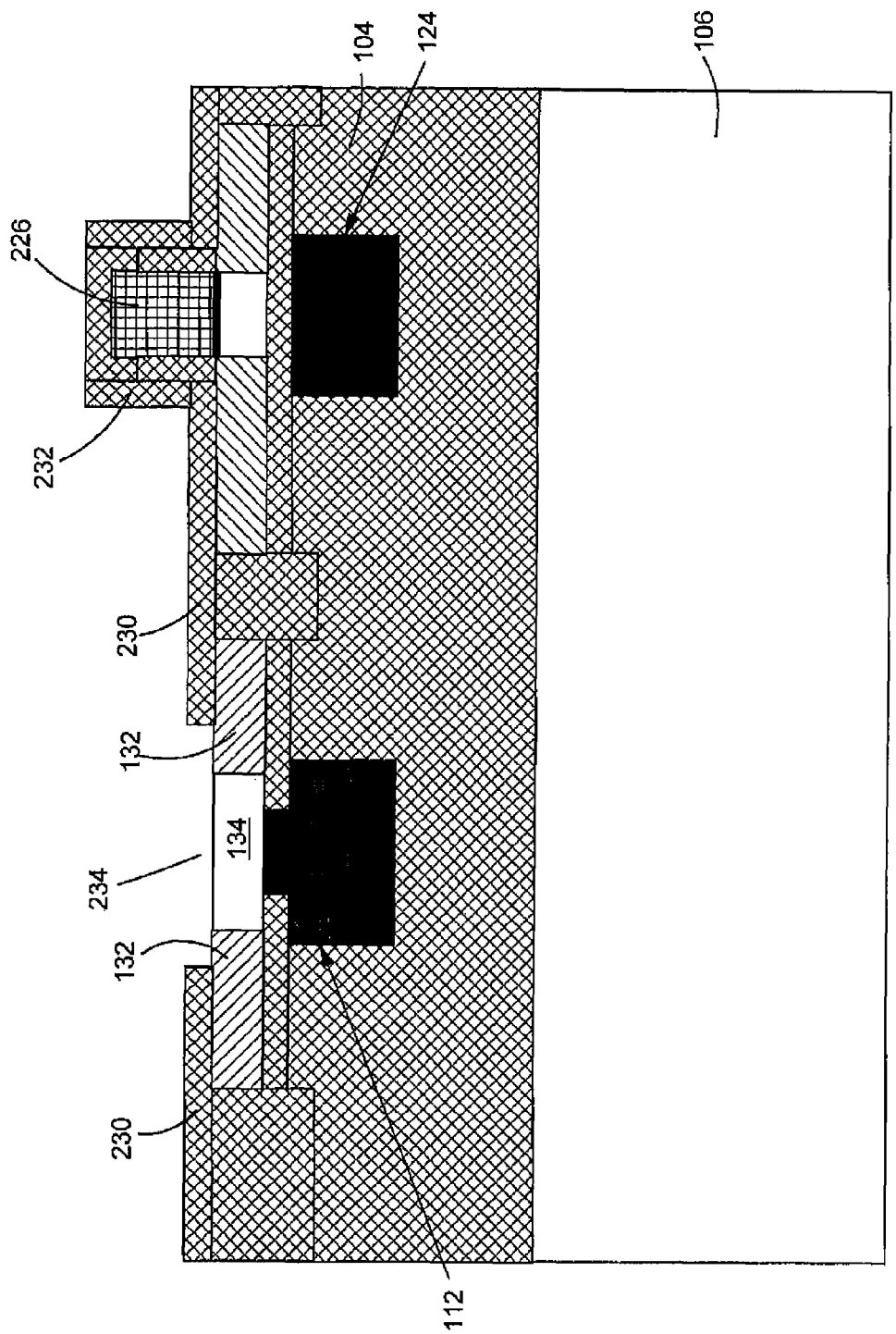

FIG. 9 shows conventional formation of shallow trench isolations (STI) 220. FIG. 10 shows formation of a gate dielectric layer 222, e.g., silicon dioxide ($SiO_2$), and then formation of a gate electrode material 224, e.g., polysilicon, copper, etc. FIG. 11 shows the structure after a number of subsequent conventional steps including patterning and etching gate dielectric layer 222 and gate electrode material 224 (FIG. 10) to form a gate electrode 226; forming extensions and halos (not shown) for gate electrode 226; and depositing, patterning and etching dielectric films, e.g., silicon dioxide ($SiO_2$) and/or silicon nitride ($Si_3N_4$) (not shown) to form a dielectric cap layer 230 and a spacer 232 for gate electrode 226. In terms of the latter step, an opening 234 is provided in dielectric cap layer 230 over base regions 132, 134. It should be recognized that at this stage a variety of different processes known to those with skill in the art may be provided relative to formation and/or adjustment of base regions 132, 134.

Figure 12:
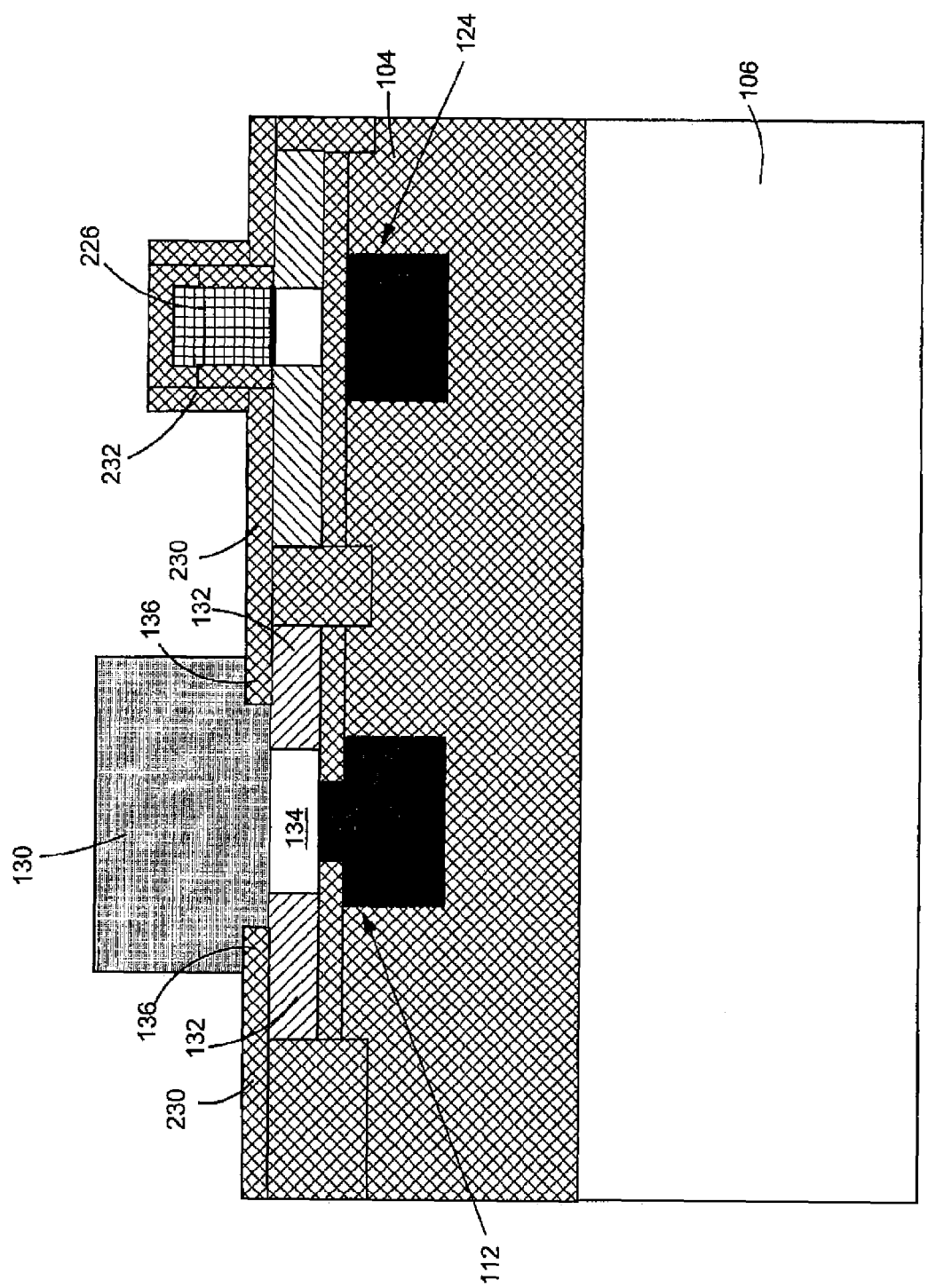

FIG. 12 shows formation of collector region 130 over base regions 132, 134. Collector region 130 may be formed in a variety of fashions depending on the above-mentioned base regions 132, 134 formation and/or adjustment. For example, collector region 130 may be selectively grown silicon, which is doped, accordingly, in-situ or by implantation. Prior to collector growth, or as an initial stage of collector growth, a silicon-germanium (SiGe) layer may be formed to serve as the intrinsic base region. This silicon-germanium base growth may optionally comprise etching all or some portion (a region above layer 124) of layer 202 in the bipolar transistor structure. Alternatively, collector region 130 may be formed by polysilicon grading to generate a variable doping in collector region 130. In any event, collector region 130 may also be implanted once complete to attain the appropriate doping. Of note, however, collector region 130 is formed to extend over extrinsic base region 132 and is partially isolated therefrom by a portion 136 of a dielectric, i.e., of dielectric cap layer 230.

Returning to FIG. 1, finishing steps may include, for example, forming a spacer 240 for collector region 130, e.g., by depositing and etching silicon nitride ($Si_3N_4$), and directionally etching away a remainder of dielectric cap layer 230.

It should be recognized that the above-described method is only illustrative and that other steps may also be used to generate structure 100.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

The invention claimed is:

1. A method of forming a structure, the method comprising the steps of:
   forming an inverted bipolar transistor on a substrate including an insulator layer on a bulk layer, the inverted bipolar transistor including an emitter region; and
   forming a back-gated transistor on the substrate,
   wherein a back-gate conductor of the back-gated transistor and the emitter region are in the same layer of material.

2. The method of claim 1, wherein the forming steps occur at least partially simultaneously.

3. The method of claim 1, wherein the emitter region and the back-gate conductor include one of: single crystal silicon and polysilicon.

4. The method of claim 1, wherein the layer of material includes the insulator layer.

5. The method of claim 1, wherein the inverted bipolar transistor forming step includes forming at least a portion of an emitter region in the insulator layer.

6. The method of claim 5, wherein the emitter region forming step includes forming substantially all of the emitter region in the insulator layer.

7. The method of claim 1, wherein the inverted bipolar transistor forming step includes forming a collector region that extends over an extrinsic base region and is partially isolated therefrom by a portion of a dielectric.

8. The method of claim 1, wherein the forming steps includes the step of inverting a partially formed structure.

* * * * *